United States Patent [19]

Chiba

[11] Patent Number: 4,924,073
[45] Date of Patent: May 8, 1990

[54] METHOD OF CONTROLLING HEAT TREATMENT APPARATUS FOR SUBSTRATE

[75] Inventor: Takatoshi Chiba, Kyoto, Japan

[73] Assignee: Dainippon Screen Mfg. Co., Ltd., Japan

[21] Appl. No.: 308,094

[22] Filed: Feb. 8, 1989

[30] Foreign Application Priority Data

Feb. 9, 1988 [JP] Japan .................................. 63-28262

[51] Int. Cl.$^5$ ........................... F27B 5/14; H05B 1/02
[52] U.S. Cl. ................................... 219/413; 219/411; 219/494
[58] Field of Search ............... 219/405, 411, 412, 413, 219/494, 497, 501; 374/133, 134, 1

[56] References Cited

U.S. PATENT DOCUMENTS 4,678,432 7/1987 Teraoka .................................. 432/12
4,820,907 4/1989 Terauchi .............................. 219/494

FOREIGN PATENT DOCUMENTS 61-177715 8/1986 Japan .................................. 374/134
62-52926 7/1987 Japan .

Primary Examiner—Teresa J. Walberg
Attorney, Agent, or Firm—Ostrolenk, Faber, Gerb & Soffen

[57] ABSTRACT

A semiconductor wafer (1) is thermally treated in a prescribed heating cycle while it is introduced into a furnace casing (4) of a furnace (4) and discharged therefrom. A temperature of a monitor chip (11) is measured by a radiation thermometer (16) immediately before introduction of the semiconductor wafer and memorized as an idling temperature. Then, while the furnace is heated up in order to make a measured temperature of the monitor chip agree with the idling temperature without the semiconductor wafer introduced, a temperature of the furnace casing is measured by a radiation thermometer (8) and memorized as a warm-up temperature. The furnace is controlled on the basis of the warm-up temperature or the idling temperature prior to sequential heat treatment of a number of semiconductor wafers.

17 Claims, 2 Drawing Sheets

METHOD OF CONTROLLING HEAT TREATMENT APPARATUS FOR SUBSTRATE

BACKGROUND OF THE INVENTION

1. Field of the Invention

The present invention relates to a method of controlling an apparatus for sequentially heat treating a series of substrates, such as semiconductor wafers, in a furnace or the like.

2. Description of the Prior Art

To manufacture semiconductor wafers, heat treatment is performed in various steps. During such heat treatment, it is very important to control the temperature of the furnace into which the wafers are introduced.

Japanese Patent Laying-Open Gazette No. 160512/1987 discloses an example of a preferable method of controlling the temperature of such a furnace. In this method, wafers are heated by radiation in a furnace which is controlled in an open-loop manner according Stefan-Boltzmann's law. With such a method, temperature for heat treatment can be controlled with considerable accuracy while a series of wafers are periodically and sequentially introduced into the furnace to be thermally treated.

However, highly accurate temperature control cannot always be attained with the known method, especially during heat treatment of the first of a series of wafers, that is, when power is supplied to a furnace while the furnace is at room temperature, or when heat treatment is resumes after an interval of non-use. This is because power is supplied to the furnace on the premise that the furnace is always in some constant state at the start of the heat treatment of each wafer. However, the state of the furnace during a starting operation or a re-starting operation is different. Therefore, the first several wafers heated during a starting operation, or during a restarting operation, must be disposed of as defective because of inaccurate temperature control. As a result, the yield of wafers is undesirably reduced.

To solve this problem, the following two techniques have been proposed In the first technique, a dummy wafer is introduced into a furnace simultaneously with a product wafer which is to be actually subjected to heat treatment. The product wafer is hereinafter referred to as "object wafer". The temperature of the dummy wafer is monitored through a thermocouple or the like and the furnace is controlled in a closed-loop manner according to the temperature of the dummy wafer.

In the second technique, the furnace is controlled in a closed-loop manner on the basis of the temperature of the object wager, as monitored by a radiation thermometer.

In the first technique, however, since the dummy wafer is introduced into the furnace separately from the object wafers, an additional device for handling the dummy wafer is required. Further, since the temperature of the dummy wafer is monitored to indirectly determine the temperature of the object wafers, the size of the dummy wafer is identical to the size of the object wafers. This makes the handling device fairly large. Therefore, the apparatus as a whole is inevitably increased in size and complicated.

The second technique does not have the problem of the first technique because the temperature of the object wafers is measured directly by the radiation thermometer. A dummy wafer is not utilized. However, since thermal radiation from the casing of the furnace is reflected by a surface of an object wafer, thermal radiation incident upon the radiation thermometer, which is directed to the object wafer, includes not only thermal radiation from the object wafer itself but that from a quartz tube forming the furnace casing. Thus, the radiation thermometer must be calibrated in advance in a normal cycle operation where the object wafers are periodically and sequentially treated. In spite of the calibration, however, considerable errors are caused in the starting operation and the re-starting operation because of the low temperature of the quartz tube. Consequently, temperature information from the radiation thermometer is not always reliable. In other words, heat treatment control does not always shown high reproducibility. Further, the reproducibility of the heat treatment control is significantly reduced when the radiation thermometer is installed toward a rear surface of the semiconductor wafer because the rear surface is satin-finished and likely to irregularly reflect thermal radiation from the quartz tube.

Incidentally, the term "substrate" in this specification refers to any kind of substrate such as a semiconductor substrate (a semiconductor wafer), a ferrite substrate for magnetic recording or the like.

Accordingly, an object of the present invention is to provide a control method which can improve reproducibility in heat treatment of substrates when starting and re-starting operations without increasing the size or complexity of the heat treatment apparatus.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a waveform diagram of temperature during calibration;

DETAILED DESCRIPTION OF THE PREFERRED EMBODIMENTS

Figure 1A:
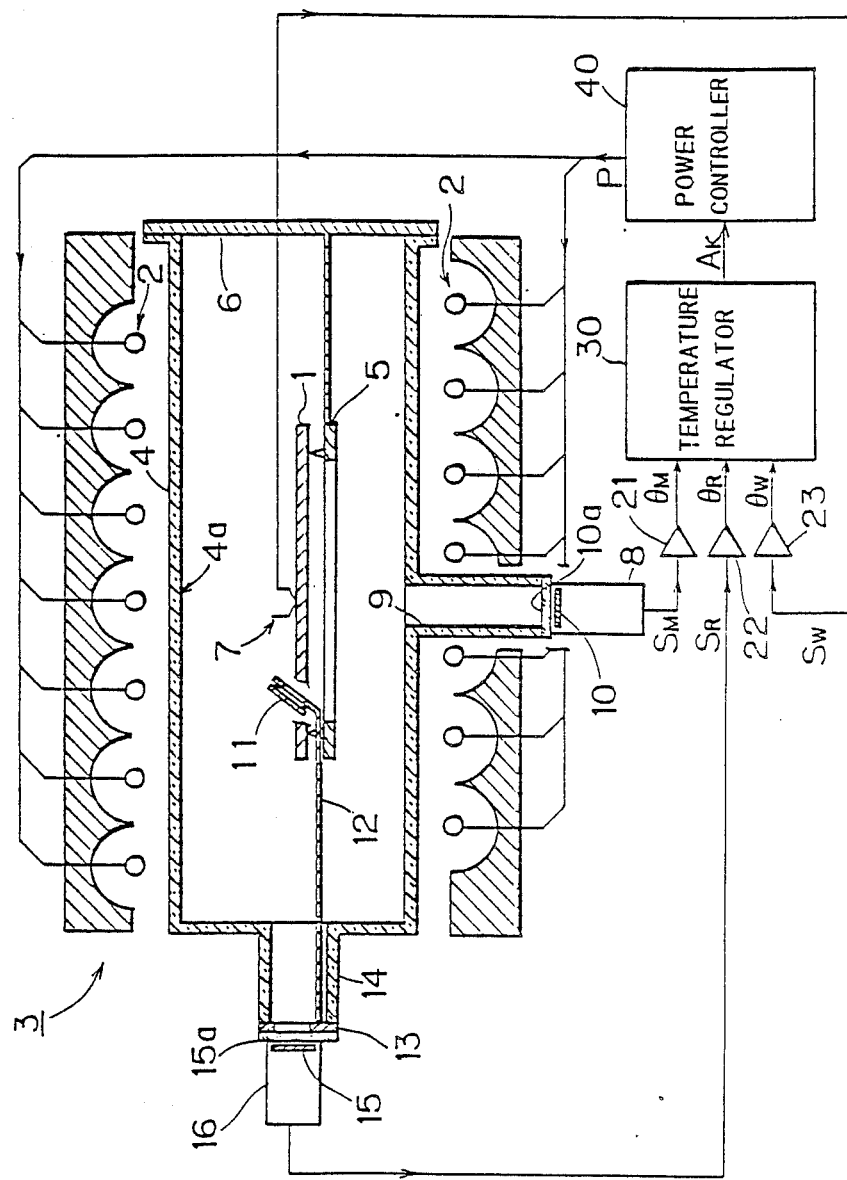
FIG. 1A is a schematic view of a heat treatment apparatus according to a preferred embodiment of the invention.
Figure 1B:
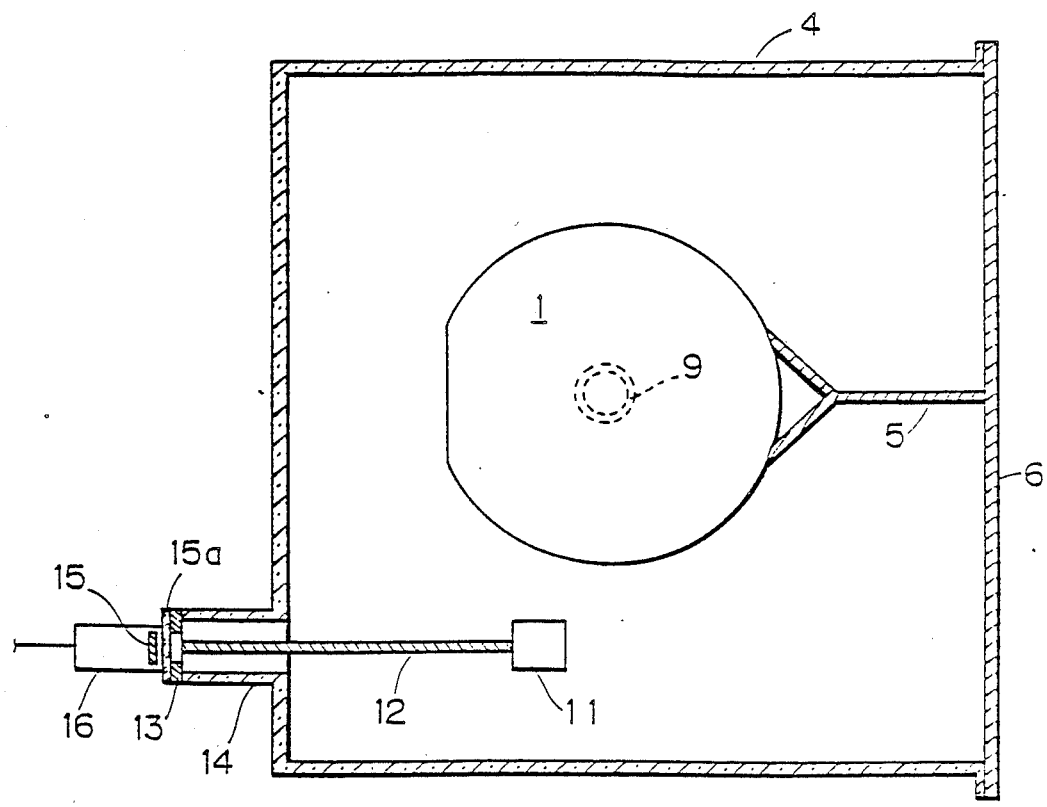
FIG. 1B is a cross-sectional view of a part of the heat treatment apparatus of FIG. 1A.

Referring to FIGS. 1A and 1B, a semiconductor wafer 1 to be subjected to heat treatment is introduced into a furnace casing 4 of a furnace 3 which is provided with a plurality of radiation heat sources (lamp heaters) 2 on upper and lower sides of the furnace 3. The semiconductor wafer 1 is supported by a suscepter 5. The suscepter 5 is joined to a flange 6 which seals an inlet of the furnace casing 4. A measuring terminal of a thermocouple 7 is fixed to the upper surface of the wafer 1.

The thermocouple 7 is installed only during calibration of a radiation thermometer 8 for monitoring the wafer 1, that is, only when the wafer 1 is a dummy wafer. The thermocouple 7 is not installed when the wafer 1 is an object wafer.

The suscepter 5, the wafer 1 and the thermocouple 7 are simultaneously introduced into the furnace casing 4 and discharged from it when the flange 6 is connected to and disconnected from the furnace casing 4, respectively.

The radiation thermometer 8 (hereinafter referred to as "wafer monitor RTM" is located at the lower side of the furnace 3. Thus, the wafer monitor RTM measures the temperature of the wafer 1 in a noncontact manner. To guide heat radiation from the wafer 1 to the wafer monitor RTM 8, a cylindrical port 9 is integrally formed in a lower portion of the furnace casing 4 under the wafer 1. A window member 10a is mounted on an end opening of the port 9. The window member 10a separates the interior of the furnace from the outside but transmits heat radiation of a certain wavelength range. A filter 10 is mounted on the receiving surface of the wafer monitor RTM 8 to transmit only heat radiation of a limited waveform range to the wafer monitor RTM 8.

The furnace casing 4 is a tube made of a material, such as quartz, which readily transmits radiation heat from the lamp heaters 2.

The filter 10 cuts off heat radiated directly from the lamp heaters 2 to prevent the heat from being received by the wafer monitor RTM 8. On the other hand, the filter 10 transmits heat radiated mainly from the wafer 1. The transmittance characteristic of the filter 10 is determined as follows: Within light emitted from the lamp heaters 2, light with a wavelength of about 0.15 to 4.5 $\mu$m is readily transmitted through quartz. This light passes through the furnace casing 4 and heats the wafer 1. On the other hand, light having a wavelength greater than $5\mu$ is not readily transmitted through quartz, and therefore does not pass through the furnace casing 4 to heat the wafer monitor RTM 8. In other words, any light having a wavelength of more than 5 $\mu$m which is incident on the wafer monitor RTM 8 must be radiated mainly from the wafer 1 and not directly from the lamp heaters 2.

Thus, the filter 10 is a bandpass filter which selectively transmits light having a wavelength of about 5 to 10 $\mu$m. The window member 10a is made of barium fluoride (BaF$_2$) which transmits light of about 0.15 to 15 $\mu$m in wavelength. Thus, light emitted from the wafer 1 which has a wavelength of about 5 to 10 $\mu$m passes through the window member 10a and the filter 10 and enters the wafer monitor RTM 8, which in turn monitors the temperature of the wafer 1.

In the furnace casing 4, a monitor chip 11 is supported by a support mechanism 12 to detect the internal temperature of the furnace casing 4 separately from the temperature of the wafer 1. The support mechanism 12 is joined with a fixing ring 13, which is fixed to an end opening of a cylindrical port 14. The port 14 is integrally formed at the side surface of the furnace casing 4. A radiation thermometer 16 for monitoring the internal temperature of the furnace (hereinafter referred to as "furnace monitor RTM") is fixed to the end opening of the port 14. The fixing ring 13 and a window member 15a are located between the end opening of the port 14 and the furnace monitor RTM 16. A filter 15 is mounted on the receiving surface of the furnace monitor RTM 16. The window member 15a is formed of barium fluoride (BaF$_2$) like the window member 10a, and the filter 15 is formed as a bandpass filter like the filter 10.

The monitor chip 11 is made of the same material (Si) as the wafer 1, for example. Therefore, the monitor chip 11 is heated by the lamp heaters 2 and supplies heat radiation to the furnace monitor RTM 16. The monitor chip 11 is supported obliquely with respect to the upper and lower surfaces of the furnace casing 4, that is, oblique to the upper and lower surfaces of the wafer 1. Accordingly, the monitor chip 11 reflects a portion of the heat radiated from the inner surface of the furnace casing 4 and directs the portion to the furnace monitor RTM 16. Thus, the furnace monitor RTM 16 measures the internal temperature of the furnace casing 4 (hereinafter referred to as "furnace interior temperature"). The furnace interior temperature represents the monitor chip 11 and the furnace casing 4, as a whole.

Output signals $S_M$, $S_R$ and $S_W$ outputted from the wafer monitor RTM 8, the furnace monitor RTM 16 and the thermocouple 7 are amplified by amplifiers 21, 22 and 23, respectively, to form signals indicating a wafer monitor temperature $\theta_M$, a furnace monitor temperature $\theta_R$ and a wafer temperature $\theta_W$, respectively. These temperature signals are suppled to a temperature regulator 30. The temperature regulator 30 performs signal processing on the basis of the temperature signals, as described later in detail, to thereby supply a power control sign $A_k$ to a power controller 40. The power controller 40 in turn supplies power P to the lamp heaters 2 to heat the wafer 1.

Figure 1C:
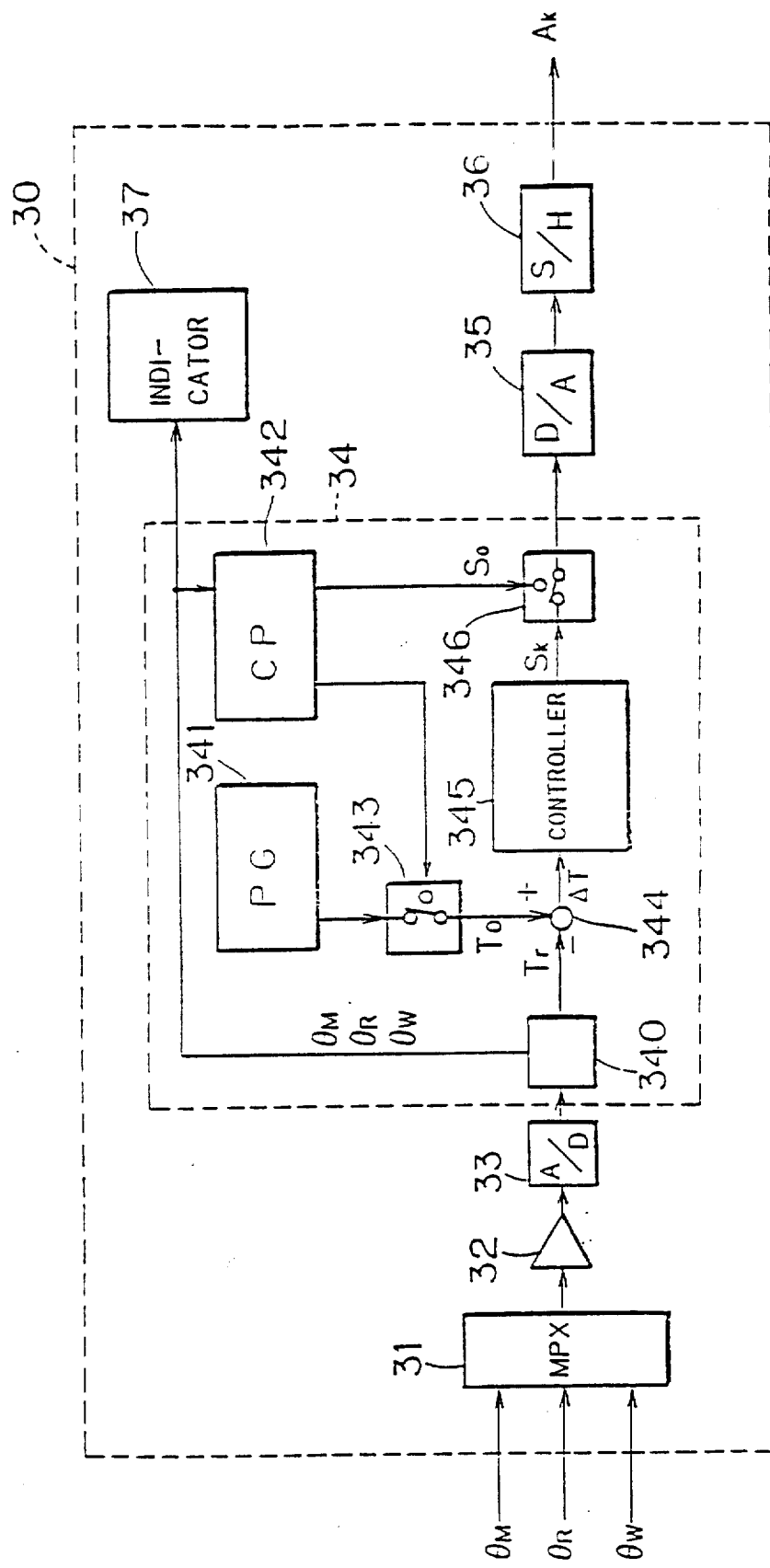
FIG. 1C is a block diagram of the internal structure of a temperature regulator 30.

FIG. 1C is a functional block diagram of the temperature regulator 30. The signals indicating the wafer monitor temperature $\theta_M$, the furnace monitor temperature $\theta_R$ and the wafer temperature $\theta_W$ inputted in the temperature regulator 30 are converted into a timedivision multiplex signal by a multiplexer 31. This signal is amplified by an amplifier 32 and converted into a digital signal by an A-D converter 33, to be supplied to a microcomputer 34. Structurally, the microcomputer 34 includes a CPU and a memory which are not illustrated in FIG. 1C.

Figure 2:
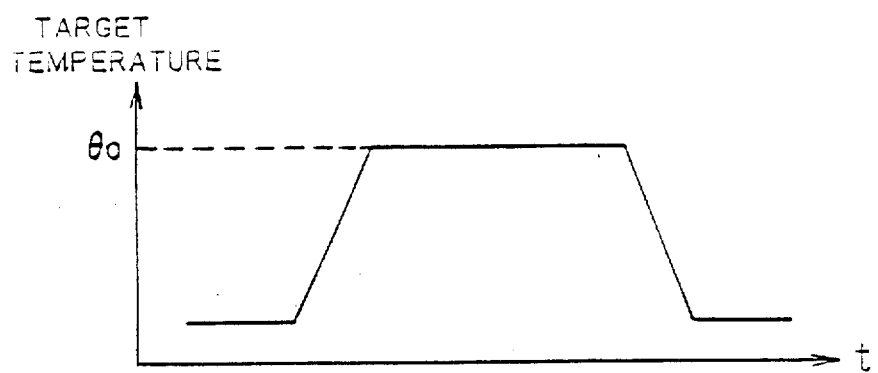
FIG. 2 illustrates an example of a standard temperature profile.

The microcomputer 34 includes a program generator 341 and a control parameter memory 342. The program generator 341 stores in advance a target temperature profile as program data which expresses a prescribed value of heat treatment with a parameter of time t as shown in FIG. 2. For example, the control parameter memory 342 is adapted to store constant values such as a reference temperature value, a constant output value etc., as described later in detail, which are not dependent on time.

A first switch 343 is switched according to a heat treatment mode, whereby either the target temperature profile outputted from the program generator 341 or the reference temperature value outputted from the control parameter memory 342 is supplied to a subtracter 344 as a target temperature $T_O$. Data distributor 340 is provided between the other input terminal of the subtracter 344 and the A-D converter 33. The data distributor 340 executes sampling of the digitalized time-division multiplex signal from the A-D converter 33 to supply a signal expressing the wafer monitor temperature $\theta_M$ or the furnace monitor temperature $\theta_R$ to the subtracter 344 as a detected temperature $T_r$.

The subtracter 344 computes a temperature deviation $\Delta T$ by subtracting the detected temperature $T_r$ from the target temperature $T_O$, to supply the temperature deviation $\Delta T$ to controller 345. The controller 345, using closed-loop control such as PID control, generates a digital control sign $S_k$ on the basis of the temperature deviation $\Delta T$. A second switch 346 is switched to transmit either the control signal $S_k$ or a constant output signal $S_O$ from the control parameter memory 342 in response to the heat treatment mode, to supply the same to a D-A converter 35 outside of the microcomputer 34 is converted into an analog signal by the D-A converter 35, to be further converted through a sample-and-hold circuit 36 into a power control sign $A_k$, which is an output signal from the temperature regulator 30.

On the other hand, the data distributor 340 supplies the signals indicating the wafer monitor temperature $\theta_M$, the furnace monitor temperature $\theta_R$ and the wafer $\theta_W$, which are separated from the time-division multiplex signal supplied from the A-D converter 33, to the control parameter memory 342 and an indicator 37. Thus, the indicator 37 indicates these temperature values, while the control parameter memory 342 stores a current value of either of these temperatures.

Figure 3:
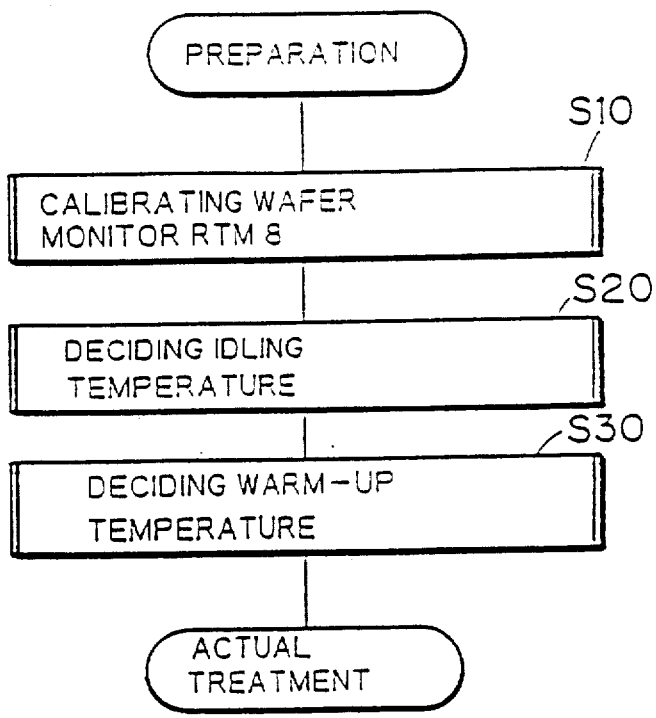
FIG. 3 is a flow chart of preparation steps.

In this embodiment, the following three steps are executed prior to heat treatment of object wafers (FIG. 3):

(1) Calibration of the wafer monitor RTM 8 (step S10)

(2) Determination of an idling temperature (step S20)

(3) Determination of a warm-up temperature (step S30)

Calibration of the wafer monitor RTM 8 involves adjusting the gain of the amplifier 21 so that the wafer monitor temperature $\theta_M$ measured by the wafer monitor RTM 8 agrees with the wafer temperature $\theta_W$ measured by the thermocouple 7. Since an amplifier for a radiation thermometer generally has a variable resistor for gain control, as well known in the art, the gain of the amplifier 21 can be changed by adjusting the variable resistor.

The term "idling temperature" indicates a constant value at which the furnace monitor temperature $\theta_R$ is to be maintained while sequential heat treatment of product wafers (object wafers) is suspended. When this idling temperature is maintained, object wafers can be accurately heat treated immediately after restarting the sequential heat treatment. As described later, the idling temperature is established by measuring the furnace monitor temperature $\theta_R$ immediately before introduction of the wafers during simulation of a normal cycle operation.

The term "warm-up temperature" indicates a constant value at which the wafer monitoring temperature $\theta_M$ is to be maintained before introduction of a first wafer immediately after start-up of the heating furnace 3. When this warm-up temperature is maintained, the first wafer upon start-up of the furnace 3 can be accurately heat treated. As described later in detail, this warm-up temperature is established under a thermal condition associated with the idling temperature. The warm-up temperature and the idling temperature can be included in a common concept because each temperature expresses a characteristic temperature concerning the state of the heat treatment apparatus immediately before first introduction of a series of wafers.

Figure 4:
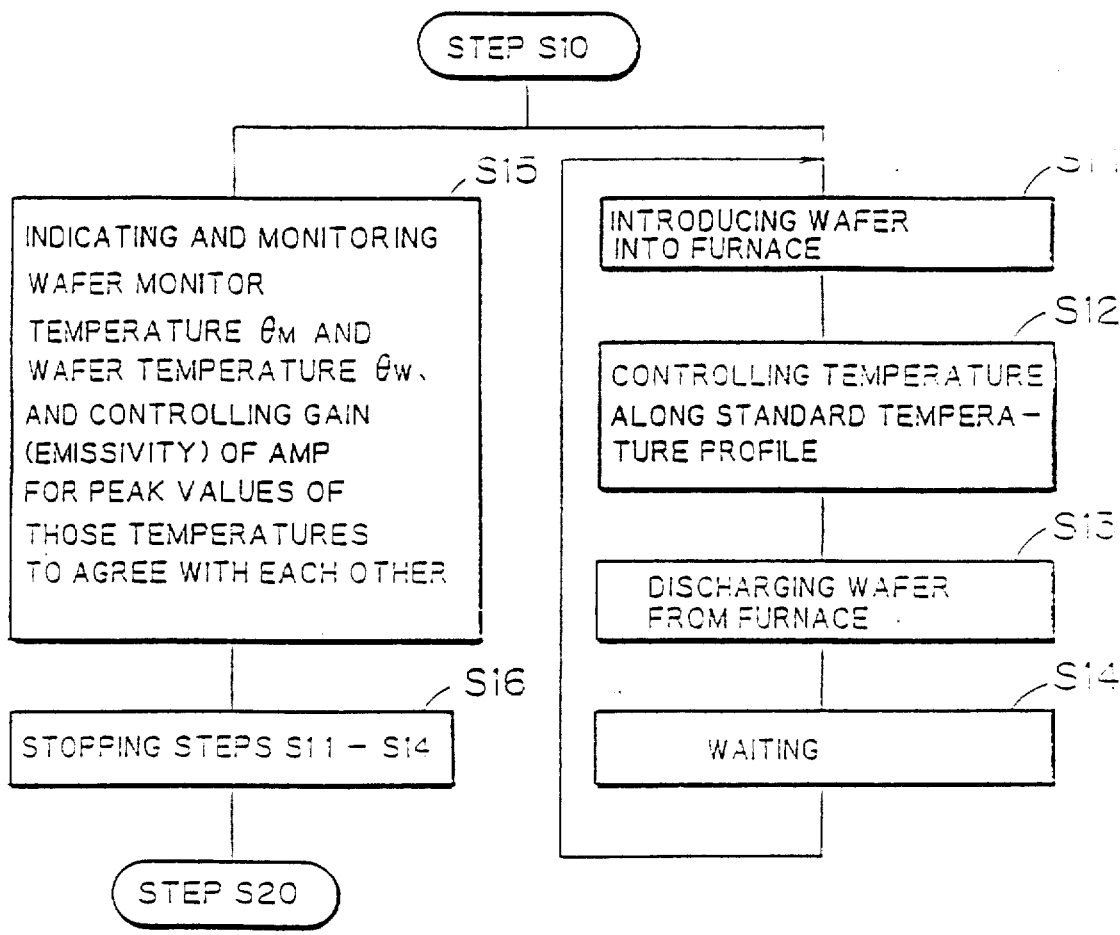
FIG. 4 is a flow chart illustrating the calibration of a wafer monitor RTM 8.
Figure 3:
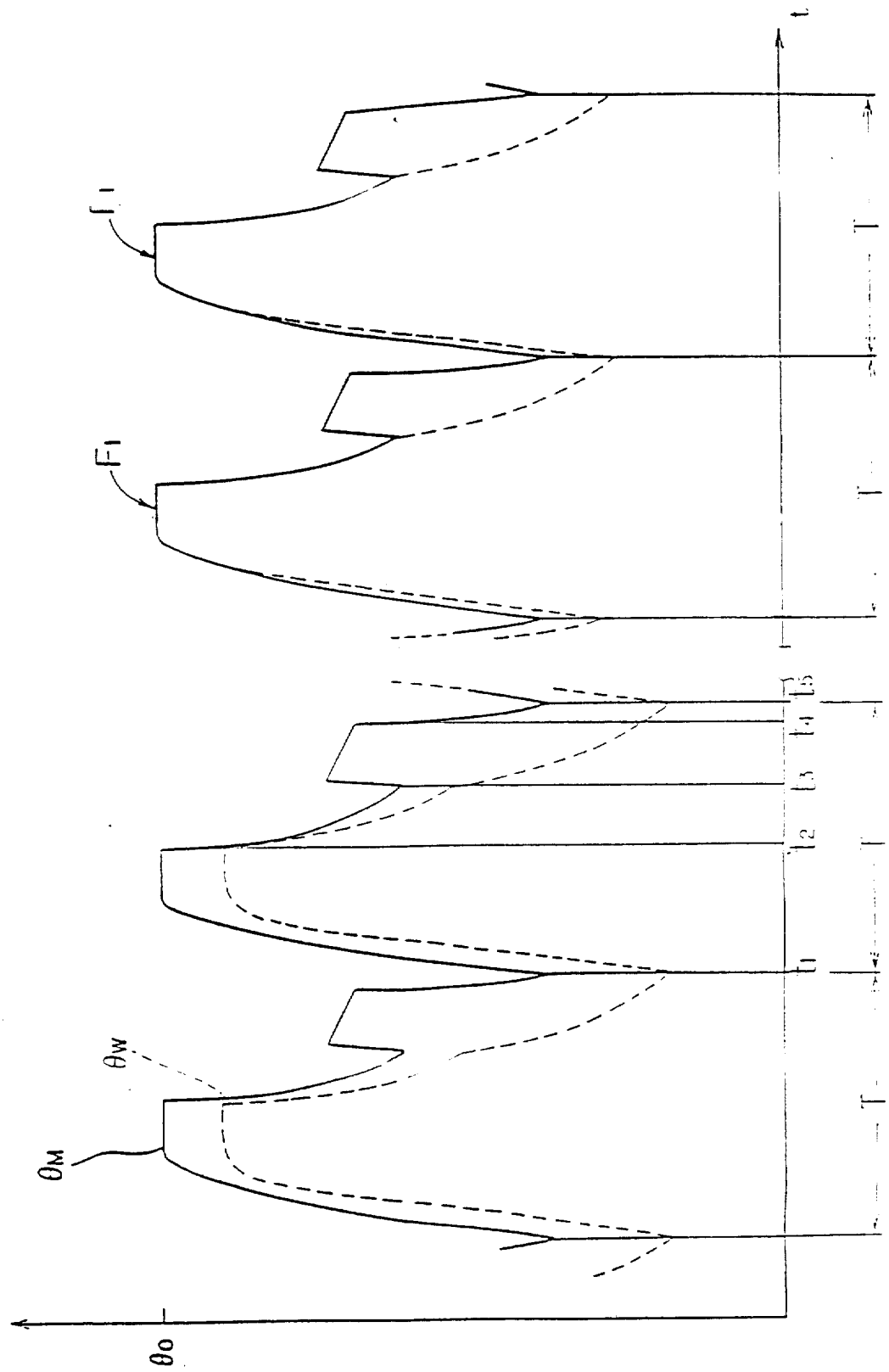

FIG. 4 illustrates the calibration of the wafer monitor RTM 8. First, a dummy wafer 1, provided with the thermocouple 7, is introduced into the furnace casing 4 (step S11). Then, the program generator 341 (FIG. 1C) outputs a target temperature value according to the target temperature profile with a parameter of time t. At this time, the data distributor 340 outputs the wafer monitor temperature $\theta_M$ measure by the wafer monitor RTM 8 as the detected temperature $T_r$. The first switch 343 is switched to the program generator 341 and the second switch 346 is switched to the controller 345 Thus, the temperature regulator 30 controls the temperature of the dummy wafer 1 under closed-loop control using the wafer monitor RTM 8 (step S12).

Upon completion of one cycle of heat treatment along the standard temperature profile (heat treatment program) of FIG. 2, the dummy wafer 1 is discharged from the furnace casing 4 (step S13). Then, the apparatus waits in this state for a period corresponding to an interval between normal discharge and introduction of wafers during sequential heat treatment. The interval is defined as one between complete discharging of one product wafer and the introduction of a subsequent product wafer during normal cyclical or sequential treatment of product wafers (step S14).

After the waiting period, the same dummy wafer 1 is again introduced into the furnace, and the steps S11 to S14 are repeated. Thus, the steps S11 to S14 are repeatedly executed to simulate a heat treatment routine which is similar to actual treatment of product wafers.

During such repetition of the steps S11 to S14, the wafer monitor temperature $\theta_M$ outputted from the wafer monitor RTM 8 and the wafer temperature $\theta_W$ outputted from the thermocouple 7 are indicated on the indicator 37 (step S15). FIG. 5 is a graph showing contents of such indication in the indicator 37 with a parameter of time t. Referring to FIG. 5, a cycle T is a time required for thermally treating one wafer including introduction, discharging, waiting and heating. The cycle T corresponds to a time required for carrying out the steps S11 to S14.

Times $t_1$ to $t_5$ represent the following points of time:

$t_1$ ... Time for start of heating upon introduction of a wafer. Temperature control along the standard temperatures profile shown in FIG. 2 is started at the time $t_1$: the lamp heaters 2 are turned on, whereby the temperature $\theta_M$ and $\theta_W$ increase. Such temperature increase is stopped when the wafer monitor temperature $\theta_M$ reaches a preset temperature $\theta_O$ (FIG. 2).

$t_2$ ... The standard temperature profile shown in FIG. 2 fails at this time. The lamp heaters 2 are turned off and the temperatures $\theta_M$ and $\theta_W$ start to decrease.

$t_3$ ... Time for discharging the wafer. When the wafer 1 is discharged from the furnace and contacts the outside air, the reduction rate of the wafer temperature $\theta_W$ measured by the thermocouple 7 increases. The wafer monitor RTM 8 receives radiation directly from a wall surface 4a (FIG. 1A) of the furnace casing (quartz tube) 4.

$t_4$ ... Time for re-introducing the wafer. Following re-introduction of the wafer, the wafer monitor RTM 8 faces the dummy wafer 1, which has been outside of the furnace, to measure its temperature, whereby the wafer monitor temperature $\theta_M$ is reduced.

$t_5$ . . . Time equivalent to the time $t_1$ for starting a subsequent heat treatment cycle.

Incidentally, the output from the wafer monitor RTM 8 does not necessarily indicate the temperature of the wafer 1 since heat radiation from the furnace casing 4 is reflected by the rear surface of the wafer 1 to enter the wafer monitor RTM 8 in addition to heat radiation from the wafer 1 itself. Further, the relationship between the output of the wafer monitor RTM 8 and the temperature of the wafer 1 depends on emissivity of the surface of the wafer 1.

On the other hand, the thermocouple 7 correctly measures the temperature of the wafer 1. Thus, the gain of the amplifier 21, that is, a set value of emissivity, is adjusted so that the wafer temperature $\theta_W$ outputted from the thermocouple 7 agrees with the wafer monitor temperature $\theta_M$ outputted from the wafer monitor RTM 8 at the heat treatment set temperature $\theta_O$ (step S15). Referring to FIG. 5, the gain of the amplifier 21 is changed until a state $F_1$ is achieved, where the peak values of the wafer monitor temperature $\theta_M$ and the wafer temperature $\theta_W$ agree with each other.

In FIG. 5, the peak value of the wafer temperature $\theta_W$, but not the wafer monitor temperature $\theta_M$, varies through the heating cycles by gain control of the amplifier 21 because a temperature-control loop operates to maintain $\theta_M = \theta_O$.

Calibration is not performed in a single heat treatment of the dummy wafer 1. Rather, calibration is performed while periodically heat treating the dummy wafer 1 because this simulates the state of the furnace in actual operation, i.e., cyclically heat treating a series of product wafers.

When the amplifier 21 is thus adjusted, repetition of the steps S11 to S14 is stopped and calibration processing is completed (step S16). Thereafter, the wafer temperature $\theta_W$ measured by the thermocouple 7 is not utilized.

Then, the process is advanced to determination of the idling temperature $\theta_I$. To establish the idling temperature $\theta_I$, the dummy wafer is employed as the wafer 1 while the steps S21 to S24 (FIG. 6) are repeated, which simulate actual heat treatment, as is the case with the steps S11 to S14 (FIG. 4). However, the indicator 37 indicates the wafer monitor temperature $\theta_M$ and the furnace monitor temperature $\theta_R$ (FIG. 7).

Figure 7:
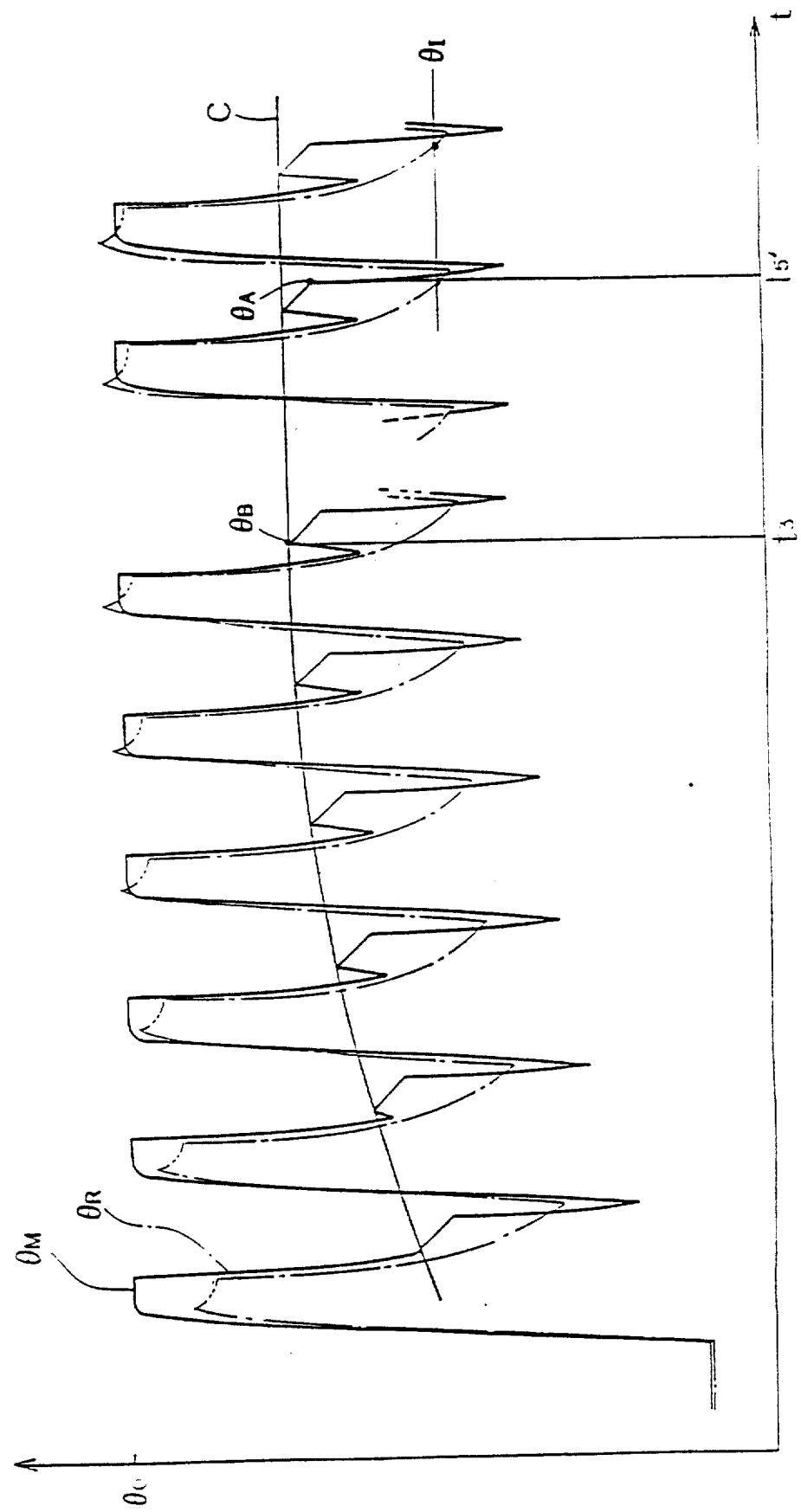
FIG. 7 is a waveform diagram of temperature during the determination of the idling temperature.

During simulated heat treatment cycles, illustrated in FIG. 7, the peak value of the furnace monitor temperature $\theta_R$ gradually increases to asymptotically reach a constant value. This is because the furnace temperature is unstable immediately after start-up but becomes stabilized during repetition of the heat treatment cycle. When the wafer 1 is discharged from the furnace at a time $t_3$, the wafer monitor RTM 7 measures the temperature of the furnace casing 4. The casing temperature $\theta_B$ at the discharge time gradually increases in accordance with stabilization of the thermal state of the furnace casing 4, to thereby asymptotically approach a constant value. FIG. 7 illustrates a path of the casing temperature $\theta_B$ by a peak envelope C.

Figure 6:
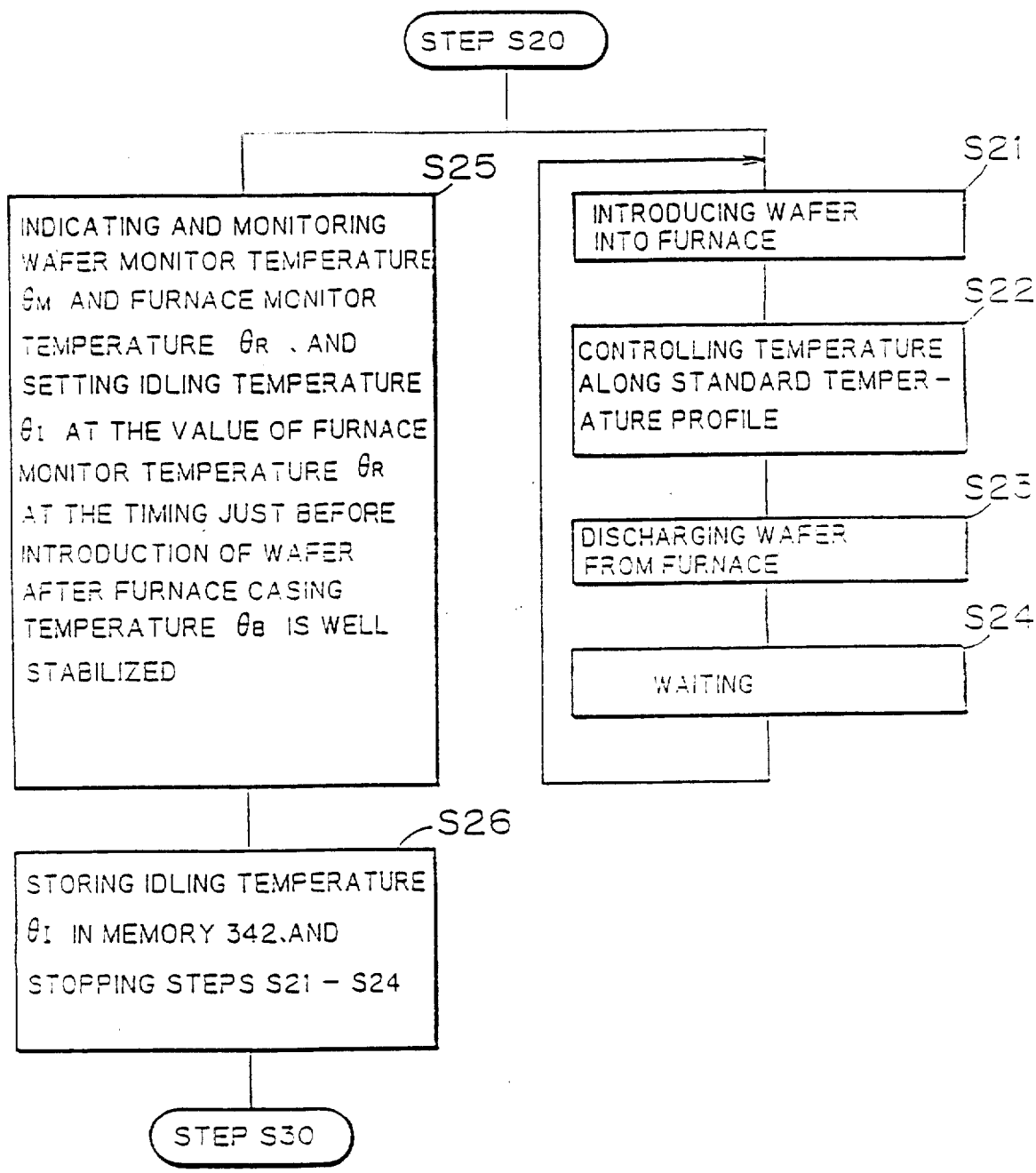
FIG. 6 is a flow chart illustrating the determination of an idling temperature.

The wafer monitor temperature $\theta_M$ is monitored at a step S25 (FIG. 6). The value of the furnace monitor temperature $\theta_R$ immediately before introduction of the wafer ($t = t_5^1$) is designated as the idling temperature $\theta_I$. However, determination of the idling temperature occurs only after the casing temperature $\theta_B$ stabilizes (step S25). In other words, the idling temperature $\theta_I$ equals the furnace monitor temperature immediately before introduction of the wafer, after the thermal state of the furnace is well stabilized during simulated periodic heat treatment.

Upon completion of the processing at the step S26, the value of the idling temperature $\theta$ is stored in the control parameter memory 342, and the process of determining the idling temperature is completed (step S26).

Figure 8:
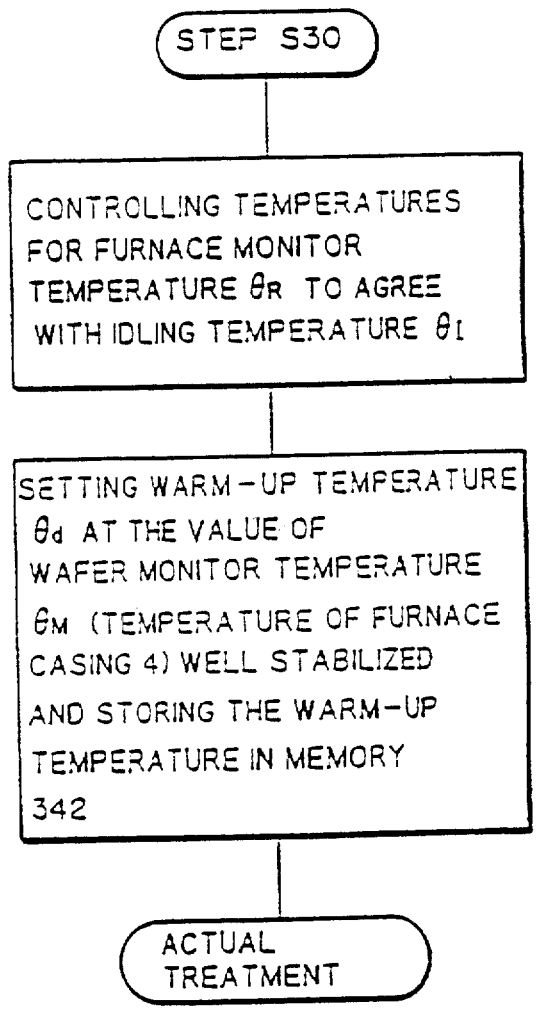
FIG. 8 is a flow chart illustrating the determination of a warm-up temperature.
Figure 9:
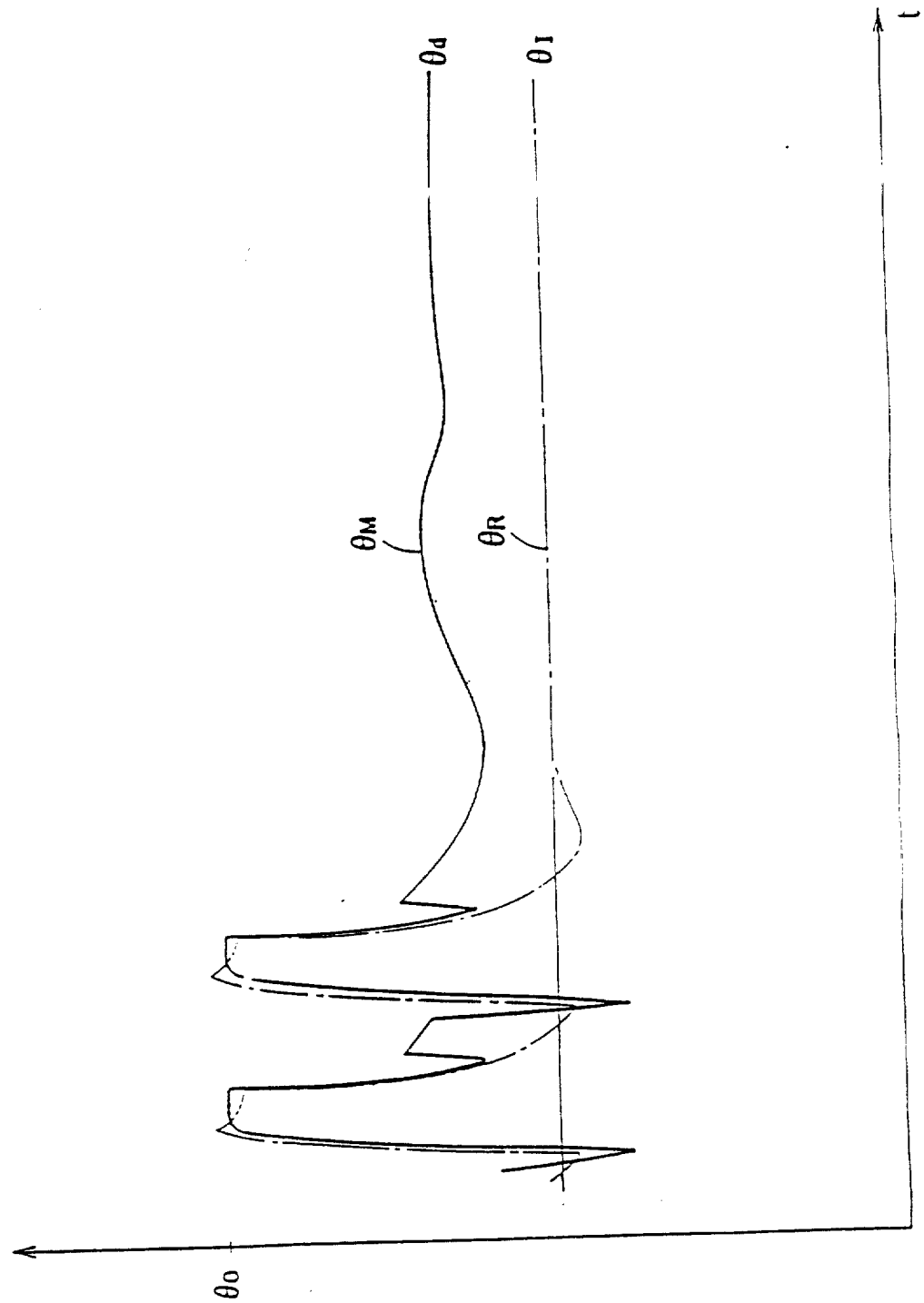
FIG. 9 is a waveform diagram of temperature during the determination of the warm-up temperature.

In the routine for determining the warm-up temperature $\theta$ (FIG. 8), the value of the idling temperature $\theta_I$ is read from the control parameter memory 342 as a reference temperature, to be supplied to the first switch 343. At this time, the first switch 343 selects the memory 342, while the data distributor 340 outputs the furnace monitor temperature $\theta_R$ as the detected temperature $T_r$. Therefore, the temperature regulator 30 executes closed-loop control of the heating furnace 3 on the basis of the idling temperature $\theta_I$. However, the dummy wafer 1 is not introduced into the furnace at this time and the heating furnace 3 is in a no-load running state with no object for treatment. The indicator 37 indicates the wafer monitor temperature $\theta_M$ (corresponding to the temperature of the furnace casing 4) since there is no wafer 1 in the furnace and the furnace monitor temperature $\theta_R$ (FIG. 9).

Since temperature control is performed on the basis of the idling temperature $\theta_I$, the furnace monitor temperature $\theta_R$ reaches the idling temperature $\theta_M$ (corresponding to the temperature of the furnace casing 4) is designated as the warm-up temperature $\theta_d$ after the furnace monitor temperature $\theta_R$ and the wafer monitor temperature $\theta_M$ are stabilized. The warm-up temperature $\theta_d$ is stored in the control parameter memory 342. While the idling temperature $\theta_I$ corresponds to the temperature within the furnace immediately before introduction of a wafer, the warm-up temperature $\theta_d$ corresponds to the temperature of the furnace casing immediately before introduction of a wafer.

Figure 10:
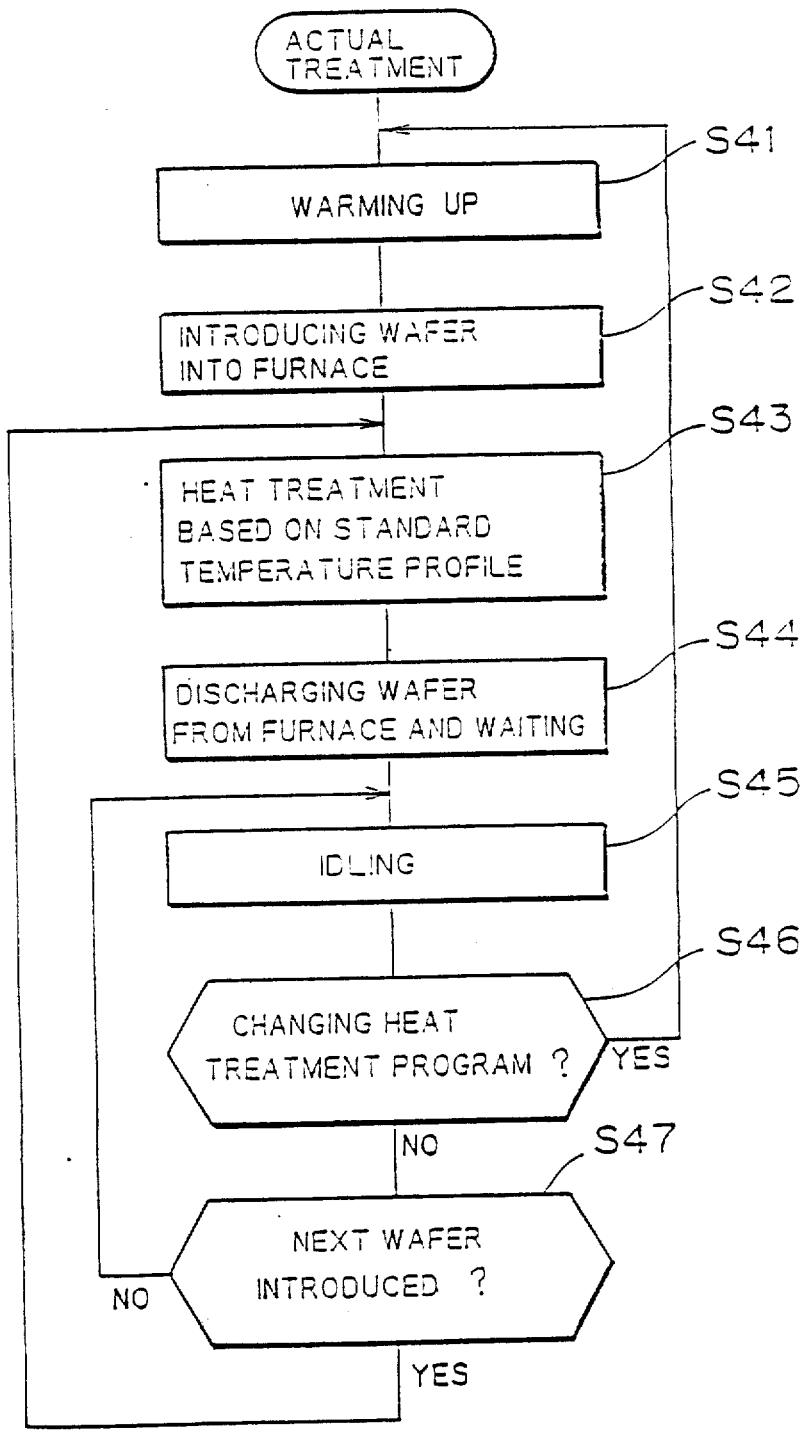
FIG. 10 is a flow chart illustrating the heat treatment of object substrates.
Figure 11:
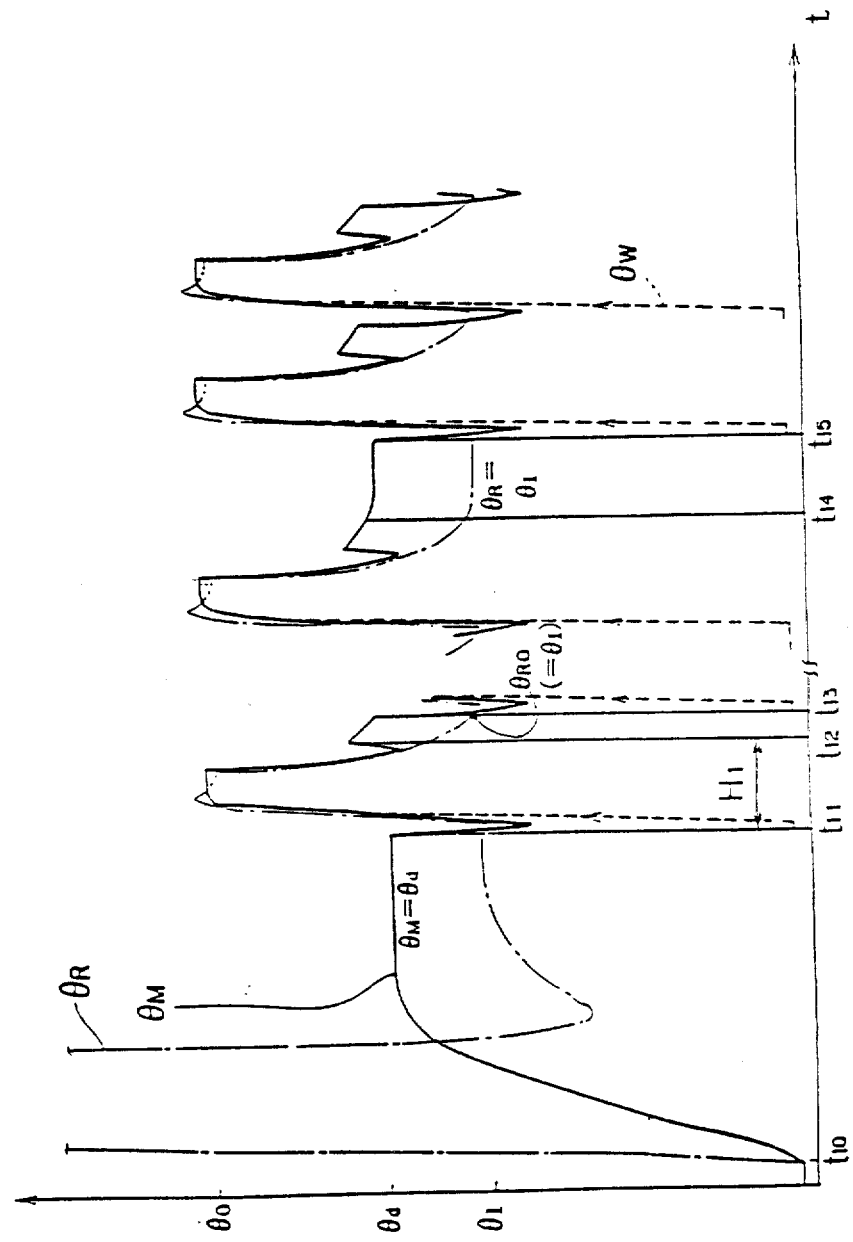
FIG. 11 is a waveform diagram of temperature during the heat treatment of object substrates.

After the preparation steps are completed as described above, actual heat treatment is periodically and sequentially executed on a series of product wafers (object wafers). FIG. 10 illustrates such heat treatment, and FIG. 11 shows an example of temperature waveforms thereof. In this actual heat treatment, no dummy wafer is employed. Rather, the wafer 1 of FIG. 1 is a product wafer. Thermocouple 7 is not mounted on the product wafer. FIG. 11 shows the wafer temperature $\theta_W$ only to illustrate the actual temperature of the wafer 1. The wafer temperature $\theta_W$ is not actually measured by the thermocouple 7.

At a step S41 (FIG. 10), the furnace is warmed up without introducing the product wafer 1 into the furnace. The second switch 346 (FIG. 1C) is switched toward the control parameter memory 342, which outputs a full power signal stored in advance for a prescribed period. Thus, the lamp heaters 2 are turned on at the maximum power only in the prescribed period to quickly raise the furnace temperature. Then, the wafer monitor temperature $\theta_M$ (corresponding to the temperature of the furnace casing 4) is outputted as the detected temperature $T_r$ (FIG. 1), and the control parameter memory 342 supplies the signal of the warm-up temperature $\theta_d$ to the subtracter 344 through the first switch 343. At this time, the second switch 346 is switch toward the controller 345. Thus, the furnace is warmed up until the temperature $\theta_M$ of the furnace casing 4 is stabilized and agrees with the warm-up temperature $\theta_d$. An interval between times $t_{10}$ and $t_{11}$ (FIG. 11) corresponds to this warm-up period. The furnace monitor temperature $\theta_R$ reaches a relatively high value in the first half of the warm-up period because thermal capacity (strictly speaking, the ratio of thermal capacity to surface area) of the monitor chip 11 is small.

After the warming-up operation is completed, a first product wafer 1 is introduced into the furnace at the time $t_{11}$ (step S42). After the introduction is completed, the heat treatment program is executed along the standard temperature profile illustrated in FIG. 2 (step S43). At this time, the wafer monitor temperature $\theta_M$ is used as the detected temperature $T_r$ (FIG. 1C), whereby closed-loop control on the basis of the temperature $\theta_M$ is performed. Consequently, the product wafer 1 is heated between the time $t_{11}$ and a time $t_{12}$ (FIG. 11), and discharged from the furnace at the time $t_{12}$ (step S44).

At a step S45, idling operation is executed to maintain the furnace monitor temperature $\theta_R$ at the idling temperature $\theta_I$. Namely, the furnace monitor temperature $\theta_R$ is employed as the detected temperature $T_r$, whereby closed-loop control is performed on the basis of deviation between the idling temperature $\theta_I$ read out from the control parameter memory 342 and the furnace monitor temperature $\theta_R$.

However, since FIG. 11 shows a case where an interval between completion of the first heat treatment cycle $H_1$ and introduction of a subsequent product wafer 1, that is, an interval between the times $t_{12}$ and $t_{13}$, agrees with a reference interval between discharge and introduction in the normal cycle operation, no substantial idling operation is performed for the following reason:

First, it is noted that, in the process for determining the idling temperature (FIG. 7), temperature control is performed with the reference period T corresponding to a single cycle of heat treatment, and that the furnace monitor temperature $\theta_R$ immediately before introduction of the wafer is designated as the idling temperature $\theta_I$. Therefore, the interior temperature of the furnace $\theta_{RO}$ immediately before introduction of a subsequent product wafer 1 becomes equal to the idling temperature $\theta_I$ (FIG. 11) as sequential heat treatment of the product wafers 1 is performed. In other words, the interior temperature of the furnace does not go down to a level at which substantial idling operation is needed. An example of substantial idling operation is described later.

The heat treatment apparatus employed in this embodiment is provided with heating means, but without forced cooling means. Therefore, the lamp heaters 2 are turned off when the furnace monitor temperature $\theta_R$ is higher that the idling temperature $\theta_I$, and the furnace is naturally cooled. Forced cooling is not necessary in this case because there is no need to abruptly cool the furnace to the idling temperature $\theta_I$ when the furnace temperature is higher than the idling temperature $\theta_I$ so long as heat treatment is not repeated in a period extremely shorter than the reference period T.

Referring again to FIG. 10, when a next product wafer 1 is introduced to be heated by the same heating program of the standard temperature profile during execution of the idling operation, the process returns from a step S47 to the step S43, to perform heat treatment. Such repetition is periodically and sequentially executed each time a new product wafer is introduced into the furnace.

On the other hand, when introduction of the product wafer 1 is interrupted between time $t_{14}$ and $t_{15}$ (FIG. 11), for example, a loop consisting of the steps S45, S46 and S47 is performed repeatedly to continuously execute substantial idling operation. Thus, the temperature within the furnace is maintained at the idling temperature $\theta_I$ until the next product wafer 1 is introduced at time $t=t_{15}$. When the next product wafer 1 is introduced at time $t=t_{15}$, the idling operation is stopped and heat treatment of the wafer 1 is started.

If several types of heat treatment programs are prepared for the product wafers 1 and are selected alternatively, the process returns from the step S46 to the step S41 at the alteration and the routine from the warming-up operation is performed again.

As apparent from FIG. 11, heat treatment of the wafers is accurately controlled immediately after startup because the warming-up operation is performed in advance. Further, the reproducibility of such temperature control is also improved with respect to wafers introduced immediately after re-starting heat treatment because the idling operation is performed while heat treatment is suspended.

In particular, the accuracy with which temperature is controlled is extremely improved because the warm-up temperature and the idling temperature are established during the preparation steps in which actual heat treatment is simulated. Further, no support mechanism for the dummy wafer is required because the dummy wafer is not introduced into the furnace simultaneously with a product wafer. Accordingly, the apparatus is not increased in size nor complicated.

In the above embodiment, the warm-up temperature is determined from the value measured by the wafer monitor RTM 8 and the idling temperature is determined from the value measured by the furnace monitor RTM 16. However, a wafer 1 is not introduced in the furnace when the values of these temperatures are determined. Thus, it is possible to determine the warm-up temperature from the value measured by the furnace monitor RTM 16 and to determine the idling temperature from the value measured by the wafer monitor RTM 8.

In this case, an indicated value $\theta_A$ of the wafer monitor RTM 8 immediately before introduction of the wafer ($t=t_5'$) can be defined as the idling temperature after the furnace casing temperature $\theta_B$ (FIG. 7) is stabilized, for example. To establish the warm-up temperature from the value measured by the furnace monitor RTM 16, the idling temperature established by using the furnace monitor RTM 16 can be employed as the warm-up temperature. According to this modification, therefore, only one of the wafer monitor RTM 8 and the furnace monitor RTM 16 is required to establish the idling temperature and the warm-up temperature. However, it is preferable to employ both of the RTMs since the furnace monitor RTM 16 can measure the interior temperature of the furnace with greater accuracy while the wafer monitor RTM 8 can measure the wafer temperature during actual treatment with greater accuracy.

Incidentally, the wafers may be thermally treated under open-loop control. Further, the present invention is not restricted to heat treatment of semiconductor wafers, but is applicable to the other types of substrates such as a ferrite substrate for magnetic recording and the like. The present invention is applicable to heat treatment of various types of objects to be thermally treated.

According to the invention, as described above, the warm-up temperature and the idling temperature are determined during preparation steps simulating actual heat treatment, and the warm-up operation and the idling operation are performed on the basis of those temperatures. As a result, the objects are accurately thermally treated even during the starting operation and the re-starting operation.

Further, since no special device is required, the heat treatment apparatus is neither increased in size nor complicated.

Although the present invention has been described in relation to particular embodiments thereof, many other variations and modifications and other uses will become apparent to those skilled in the art. It is preferred, therefore, that the present invention should be limited not by the specific disclosure herein, but only by the appended claims.

I claim:

1. A method of operating a furnace, the method comprising the steps of:
  (a) stabilizing the temperature within a furnace by heating the interior of the furnace according to a heating cycle while introducing and discharging a dummy object into and from the furnace in synchronism with the heating cycle;
  (b) after stabilizing the temperature within the furnace, and while continuing to heat the interior of the furnace according to the heating cycle while introducing and discharging the dummy object into and from the furnace in synchronism with the heating cycle, and immediately prior to introducing the dummy object into the furnace, measuring and storing an idling temperature corresponding to the temperature within the furnace;
  (c) subsequently, heat treating objects to be treated by heating the interior of the furnace according to the heating cycle while sequentially introducing and discharging the objects to be treated into and from the furnace in synchronism with the heating cycle; and
  (d) after heat treating the objects to be treated, maintaining the temperature within the furnace in accordance with the idling temperature.

2. The method of claim 1, wherein the step of measuring the idling temperature includes detecting heat radiating from a monitor chip located within the furnace.

3. The method of claim 2, wherein the monitor chip, the dummy object, and the objects to be treated are formed of the same material.

4. The method of claim 3, wherein the objects to be treated are semiconductor substrates.

5. The method of claim 2, wherein the monitor chip is oblique with respect to the objects to be treated.

6. The method of claim 2, wherein the heat radiating from the chip is detected by a radiation thermometer located at an end of a tube which is integral with the furnace.

7. The method of claim 6, wherein the heat radiating from the chip is selectively transmitted through a filter located between the chip and the thermometer, the filter selectively transmitting radiation which does not readily pass through the walls of the furnace.

8. A method of preheating a furnace, the method comprising the steps of:
  (a) stabilizing the temperature within a furnace by heating the interior of the furnace according to a heating cycle while introducing and discharging a dummy object into and from the furnace in synchronism with the heating cycle;
  (b) after stabilizing the temperature within the furnace, and while continuing to heat the interior of the furnace according to the heating cycle while introducing and discharging the dummy object into and from the furnace in synchronism with the heating cycle, and immediately prior to introducing the dummy object into the furnace, using a first radiation thermometer to measure an idling temperature corresponding to heat radiating from the interior of the furnace toward the first radiation thermometer;
  (c) subsequently, while the furnace is empty, heating the interior of the furnace so that the temperature measured by the first radiation thermometer is equal to the idling temperature;
  (d) while the furnace is empty, and while the temperature measured by the first radiation thermometer is equal to the idling temperature, using a second radiation thermometer to measure a warm-up temperature corresponding to heat radiating from the interior of the furnace toward the second radiation thermometer; and
  (e) subsequently, heating the interior of the furnace until the temperature measured by the second radiation thermometer is equal to the warm-up temperature.

9. The method of claim 8, wherein the step of using the first thermometer to measure the idling temperature includes using the first thermometer to detect heat radiating from a monitor chip located within the furnace.

10. The method of claim 9, wherein the first thermometer is located at an end of a tube which is integral with the furnace.

11. The method of claim 10, wherein the heat radiating from the chip is selectively transmitted through a filter located between the chip and the first thermometer, the filter selectively transmitting radiation which does not readily pass through the walls of the furnace.

12. The method of claim 9, wherein the step of using the second thermometer to measure the warm-up temperature includes using the second thermometer to detect heat radiating from an interior wall of the furnace.

13. The method of claim 12, wherein the second thermometer is located at an end opening of a tube which is integral with the furnace.

14. The method of claim 13, wherein the heat radiating from the interior wall is selectively transmitted through a filter located between the interior wall and the second thermometer, the filter selectively transmitting radiation which does not readily pass through the walls of the furnace.

15. A method of preheating a furnace, the method comprising the steps of:
  (a) stabilizing the temperature within a furnace by heating the interior of the furnace according to a heating cycle while introducing and discharging a dummy object into and from the furnace in synchronism with the heating cycle;
  (b) after stabilizing the temperature within the furnace, and while continuing to heat the interior of the furnace according to the heating cycle while introducing and discharging the dummy object into and from the furnace in synchronism with the heating cycle, and immediately prior to introducing the dummy object into the furnace, measuring and storing a warm-up temperature corresponding to heat radiating from the interior of the furnace toward a radiation thermometer; and (c) subsequently, heating the interior of the furnace until the temperature measured by the radiation thermometer is equal to the warm-up temperature.

16. The method of claim 15, wherein the thermometer is located at an end opening of a tube which is integral with the furnace.

17. The method of claim 16, wherein the heat radiating from the interior of the furnace is selectively transmitted through a filter, the filter selectively transmitting radiation which does not readily pass through the walls of the furnace.

* * * * *

UNITED STATES PATENT AND TRADEMARK OFFICE
CERTIFICATE OF CORRECTION

PATENT NO. : 4,924,073

DATED : May 8, 1990

INVENTOR(S) : Chiba

It is certified that error appears in the above-identified patent and that said Letters Patent is hereby corrected as shown below:

In the Figures, insert the attached Figs. 1c and 2-11.

Column 2, line 24, before "Incidentally, the term", insert the attached three pages.

UNITED STATES PATENT AND TRADEMARK OFFICE
CERTIFICATE OF CORRECTION

PATENT NO. : 4,924,073

DATED : May 8, 1990

INVENTOR(S) : Chiba

It is certified that error appears in the above-identified patent and that said Letters Patent is hereby corrected as shown below:

--<u>SUMMARY OF THE INVENTION</u>

The present invention is directed to a method of operating a furnace, the method including the steps of: (a) stabilizing the temperature within a furnace by heating the interior of the furnace according to a heating cycle while introducing and discharging a dummy object into and from the furnace in synchronism with the heating cycle; (b) after stabilizing the temperature within the furnace, and while continuing to heat the interior of the furnace according to the heating cycle while introducing and discharging the dummy object into and from the furnace in synchronism with the heating cycle, and immediately prior to introducing the dummy object into the furnace, measuring and storing an idling temperature corresponding to the temperature within the furnace; (c) subsequently, heat treating objects to be treated

UNITED STATES PATENT AND TRADEMARK OFFICE
CERTIFICATE OF CORRECTION

PATENT NO. : 4,924,073

DATED : May 8, 1990

INVENTOR(S) : Chiba

It is certified that error appears in the above-identified patent and that said Letters Patent is hereby corrected as shown below:

by heating the interior of the furnace according to the heating cycle while sequentially introducing and discharging the objects to be treated into and from the furnace in synchronism with the heating cycle; and (d) after heat treating the objects to be treated, maintaining the temperature within the furnace in accordance with the idling temperature.

The present invention is also directed to a method of preheating a furnace, the method including the steps of: (a) stabilizing the temperature within a furnace by heating the interior of the furnace according to a heating cycle while introducing and discharging a dummy object into and from the furnace in synchronism with the heating cycle; (b) after stabilizing the temperature within the furnace, and while continuing to heat the interior of the furnace according to the heating cycle while introducing and discharging the dummy object into and from the furnace in synchronism with the heating cycle, and immediately prior to introducing the dummy object into the furnace,

UNITED STATES PATENT AND TRADEMARK OFFICE
CERTIFICATE OF CORRECTION

PATENT NO. : 4,924,073

DATED : May 8, 1990

INVENTOR(S) : Chiba

It is certified that error appears in the above-identified patent and that said Letters Patent is hereby corrected as shown below:

> using a first radiation thermometer to measure an idling temperature corresponding to heat radiating from the interior of the furnace toward the first radiation thermometer; (c) subsequently, while the furnace is empty, heating the interior of the furnace so that the temperature measured by the first radiation thermometer is equal to the idling temperature; (d) while the furnace is empty, and while the temperature measured by the first radiation thermometer is equal to the idling temperature, using a second radiation thermometer to measure a warm-up temperature corresponding to heat radiating from the interior of the furnace toward the second radiation thermometer; and (e) subsequently, heating the interior of the furnace until the temperature measured by the second radiation thermometer is equal to the warm-up temperature.
>
> The present invention is also directed to a method of preheating a furnace, the method including the steps of: (a) stabilizing the temperature within a

UNITED STATES PATENT AND TRADEMARK OFFICE
CERTIFICATE OF CORRECTION

PATENT NO. : 4,924,073

DATED : May 8, 1990

INVENTOR(S) : Chiba

It is certified that error appears in the above-identified patent and that said Letters Patent is hereby corrected as shown below:

furnace by heating the interior of the furnace according to a heating cycle while introducing and discharging a dummy object into and from the furnace in synchronism with the heating cycle; (b) after stabilizing the temperature within the furnace, and while continuing to heat the interior of the furnace according to the heating cycle while introducing and discharging the dummy object into and from the furnace in synchronism with the heating cycle, and immediately prior to introducing the dummy object into the furnace, measuring and storing a warm-up temperature corresponding to heat radiating from the interior of

UNITED STATES PATENT AND TRADEMARK OFFICE
CERTIFICATE OF CORRECTION

PATENT NO. : 4,924,073

DATED : May 8, 1990

INVENTOR(S) : Chiba

It is certified that error appears in the above-identified patent and that said Letters Patent is hereby corrected as shown below:

```
the furnace toward a radiation thermometer; and (c)
subsequently, heating the interior of the furnace until
the temperature measured by the radiation thermometer
is equal to the warm-up temperature.--.
```

Signed and Sealed this

Thirty-first Day of December, 1991

Attest:

HARRY F. MANBECK, JR.

*Attesting Officer*  *Commissioner of Patents and Trademarks*